US011107725B2

United States Patent

(12) United States Patent
Liu et al.
(10) Patent No.: US 11,107,725 B2
(45) Date of Patent: Aug. 31, 2021

(54) INTERCONNECT STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Hsiang-Wei Liu, Tainan (TW); Wei-Chen Chu, Taichung (TW); Chia-Tien Wu, Taichung (TW); Tai-I Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/026,294

(22) Filed: Sep. 20, 2020

(65) Prior Publication Data

US 2021/0005510 A1 Jan. 7, 2021

Related U.S. Application Data

(63) Continuation of application No. 16/128,031, filed on Sep. 11, 2018, now Pat. No. 10,784,151.

(51) Int. Cl.

*H01L 29/40* (2006.01)
*H01L 23/52* (2006.01)
(Continued)

(52) U.S. Cl.

CPC .. *H01L 21/76807* (2013.01); *H01L 21/31111* (2013.01); *H01L 21/31144* (2013.01); *H01L 21/76832* (2013.01); *H01L 21/76834* (2013.01); *H01L 21/76871* (2013.01); *H01L 21/76877* (2013.01); *H01L 23/5226* (2013.01);
(Continued)

(58) Field of Classification Search

CPC ........... H01L 21/76807; H01L 23/5226; H01L 21/76834; H01L 23/5283; H01L 23/5329; H01L 21/76877; H01L 21/76871; H01L 21/31111; H01L 21/76832; H01L 21/31144; H01L 21/0276; H01L 21/31116

See application file for complete search history.

(56) References Cited

U.S. PATENT DOCUMENTS

2004/0238964 A1* 12/2004 Kawano ............ H01L 21/76804 257/758
2005/0170642 A1* 8/2005 Hineman .......... H01L 21/76807 438/637

(Continued)

*Primary Examiner* — Ismail A Muse
(74) *Attorney, Agent, or Firm* — WPAT, P.C., Intellectual Property Attorneys; Anthony King

(57) ABSTRACT

The present disclosure provides an interconnect structure, including a first metal line, a conductive contact over the first metal line, including a first portion, a second portion over the first portion, wherein a bottom width of the second portion is greater than a top width of the first portion, and a third portion over the second portion, wherein a bottom width of the third portion is greater than a top width of the second portion, a sacrificial bilayer, including a first sacrificial layer, wherein a first portion of the first sacrificial layer is under a coverage of a vertical projection area of the first portion of the conductive contact, and a second sacrificial layer over the first sacrificial layer, and a dielectric layer over a top surface of the second sacrificial layer.

19 Claims, 15 Drawing Sheets

125
124
126
128
W124
W123b
W123a
123
T22
22
T21
21
D
D
22
21
20
Wt
S
122
121a (121)
122
121b (121)
122
121a (121)
122
1210
Wm

(51) Int. Cl.

| | |
|---|---|
| ***H01L 23/48*** | (2006.01) |
| ***H01L 21/768*** | (2006.01) |
| ***H01L 21/311*** | (2006.01) |
| ***H01L 23/528*** | (2006.01) |
| ***H01L 23/522*** | (2006.01) |
| ***H01L 23/532*** | (2006.01) |
| *H01L 21/027* | (2006.01) |

(52) U.S. Cl.

CPC ...... *H01L 23/5283* (2013.01); *H01L 23/5329* (2013.01); *H01L 21/0276* (2013.01); *H01L 21/31116* (2013.01)

(56) References Cited

U.S. PATENT DOCUMENTS

2005/0243141 A1* 11/2005 Shaarawi ............... B41J 2/1603 347/63
2008/0020565 A1* 1/2008 Tseng ........................ G03F 1/50 438/633
2009/0250429 A1* 10/2009 Lee ................... H01L 21/76832 216/13
2010/0178771 A1* 7/2010 Oh .................... H01L 21/31144 438/700
2014/0117560 A1* 5/2014 Lee ..................... H01L 21/7681 257/774
2015/0235896 A1* 8/2015 Mieth ............... H01L 21/76807 438/637
2016/0027687 A1* 1/2016 Greco ............... H01L 21/76811 438/666
2016/0336221 A1* 11/2016 Ting .................. H01L 21/76835
2016/0372413 A1* 12/2016 Mahalingam ....... H01L 23/5226
2017/0207112 A1* 7/2017 Huang .............. H01L 21/76832
2018/0158941 A1* 6/2018 Birner ............... H01L 21/76846
2018/0261544 A1* 9/2018 Kim .................... H01L 23/5222
2019/0035734 A1* 1/2019 Ho .................... H01L 23/53295
2019/0043804 A1* 2/2019 Qian ................. H01L 21/76852
2019/0237356 A1* 8/2019 Srivastava ............ H01L 23/528
2020/0075483 A1* 3/2020 Zhou ................. H01L 23/53228
2020/0126915 A1* 4/2020 Ho .................... H01L 21/76832

* cited by examiner 20
22
21
32
128
122
121
321
CD3
41

20
22
21
128
122
121
126
125
124
123

INTERCONNECT STRUCTURE AND MANUFACTURING METHOD FOR THE SAME

CROSS REFERENCE TO RELATED APPLICATIONS

This application is a continuation of U.S. application Ser. No. 16/128,031, filed Sep. 11, 2018, and claims the benefit thereof under 35 U.S.C. 120.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

Dual damascene operation is one of the techniques of forming interconnect structures. However, with the trend of scaling down the geometry size, it is difficult to control the position of the interconnect structure during the fabrication operations, further inducing voltage breakdown, leakage issue and further deteriorate the yield rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
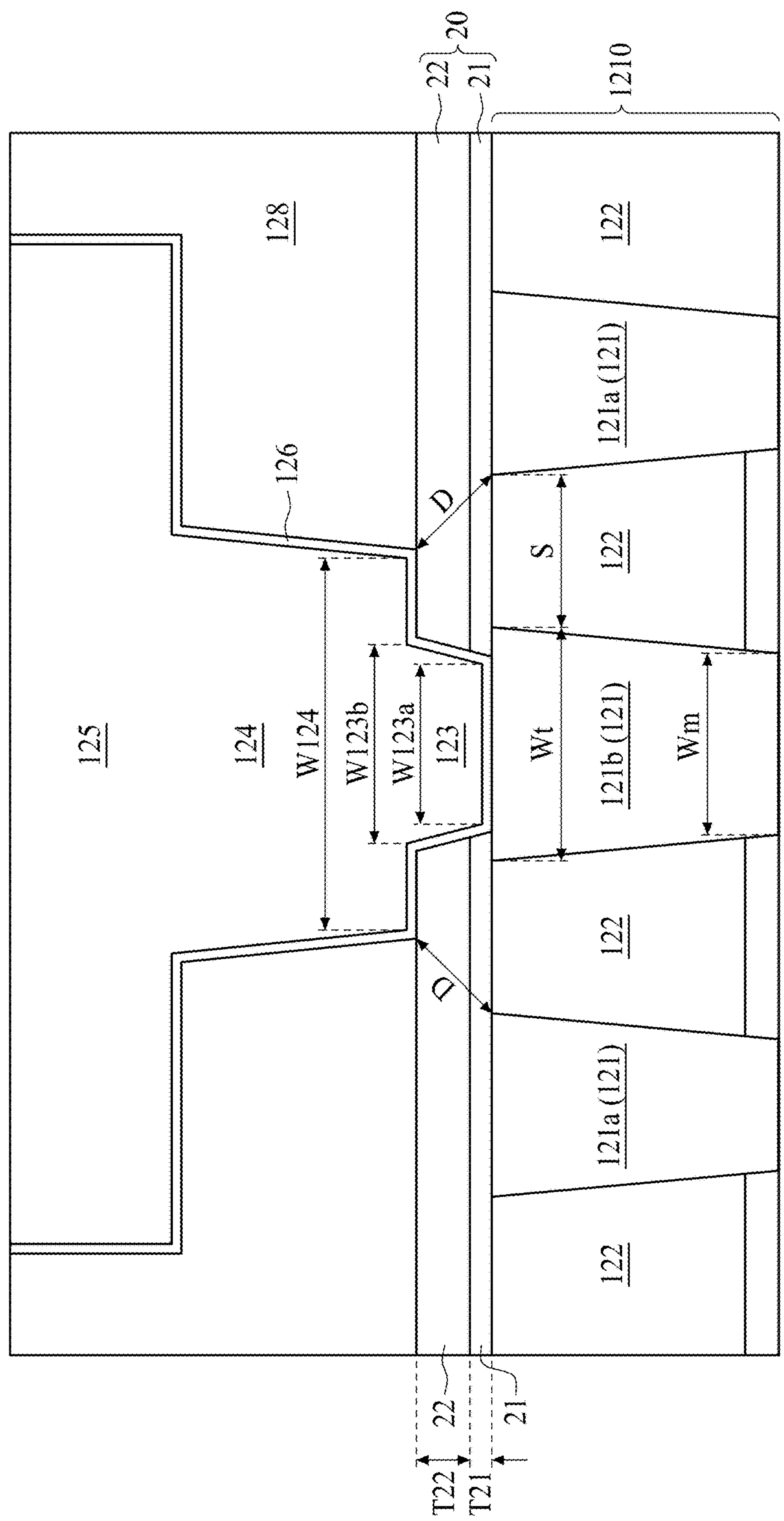
FIG. 1 is a cross section of an interconnect structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “approximately,” “substantially,” “substantial” and “about” are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be “substantially” the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, “substantially” parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, “substantially” perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The issue of voltage breakdown and/or leakage is commonly found amid metal line and a nearby metal via after the dual damascene operation. Due to the difficulty of overlay control by virtue of the landing position of vias on the metal line, formation of the via trench may be misaligned and further etching into the inter-metal dielectrics (IMD) adjacent to the metal line and forming a compartment in the IMD. When forming conductive material in the via trench, a portion of the conductive material may be inevitably deposited within the compartment of the IMD, thus a distance between the conductive material in the compartment and a nearby metal line becomes too narrow. Furthermore, conductive material is prone to form voids in the compartment due to miniature aperture size of the compartment.

As a result, overlay or misalignment of the metal via induces metal via to metal line leakage, lowering breakdown voltage, causing dielectric breakdown, or deteriorating reliability. The void in the conductive materials residing in the compartment of IMD further increase the resistance of the interconnect structure.

Referring to FIG. 1, FIG. 1 is a cross section of a interconnect structure, in accordance with some embodiments of the present disclosure. The interconnect structure includes an $N^{th}$ metal layer 1210 having an $N^{th}$ metal line 121 and an inter-metal dielectrics (IMDs) 122, a sacrificial bilayer 20, a conductive post 123, an $N^{th}$ metal via 124, an $(N+1)^{th}$ metal line 125, and a dielectric layer 128. Herein N is an integer greater than or equal to 1. A plurality of the $N^{th}$ metal line 121 is disposed in the inter-metal dielectrics (IMDs) 122, wherein a top surface of an $N^{th}$ metal line 121 may be coplanar with a top surface of the IMDs 122. The IMDs 122 may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 122 may also be close to 3.8. In some embodiments, the k values of the low-k dielectric materials are lower than about 3.0, and may be lower than about 2.5. In some embodiments, the $N^{th}$ metal line 121 may be composed of substantially pure copper (for example, with a weight percentage of copper being greater than about 90 percent, or greater than about 95 percent) or copper alloys, and may be, or may not be, substantially free from aluminum. In some other embodiments, the $N^{th}$ metal line 121 may include Cobalt (Co), Ruthenium (Ru), Tungsten (W), Graphene, or the like. In some embodiments, a minimum width Wm of the $N^{th}$ metal line 121 may be in a range from about 5 nanometer to about 35 nanometer. A minimum separation S between the adjacent $N^{th}$ metal lines 121 may be in a range from about 5 nanometer to about 35 nanometer.

The sacrificial bilayer 20 is disposed above the $N^{th}$ metal layer 1210, wherein the sacrificial bilayer 20 may include a first sacrificial layer 21 proximal to the $N^{th}$ metal layer 1210 and a second sacrificial layer 22 distal to the $N^{th}$ metal layer 1210. The first sacrificial layer 21 may include metal oxides or metal oxynitrides, such as aluminum oxynitride (AlON), aluminum oxide (AlOx, e.g. $Al_2O_3$), or the like. In some embodiments, the first sacrificial layer 21 has a thickness T21 in a range from about 10 Angstrom to about 30 Angstrom. The second sacrificial layer 22 may include silicide, oxide, carbide, oxycarbide, or nitride, such as silicon nitride (SiN), silicon carbon nitride (SiCN), silicon oxycarbide (SiOC), ornithine decarboxylase (ODC), or the like. In some embodiments, the second sacrificial layer 22 has a thickness T22 in a range from about 30 Angstrom to about 70 Angstrom. The properties of selected materials herein will be subsequently discussed in FIG. 7 to FIG. 13.

Figure 2:
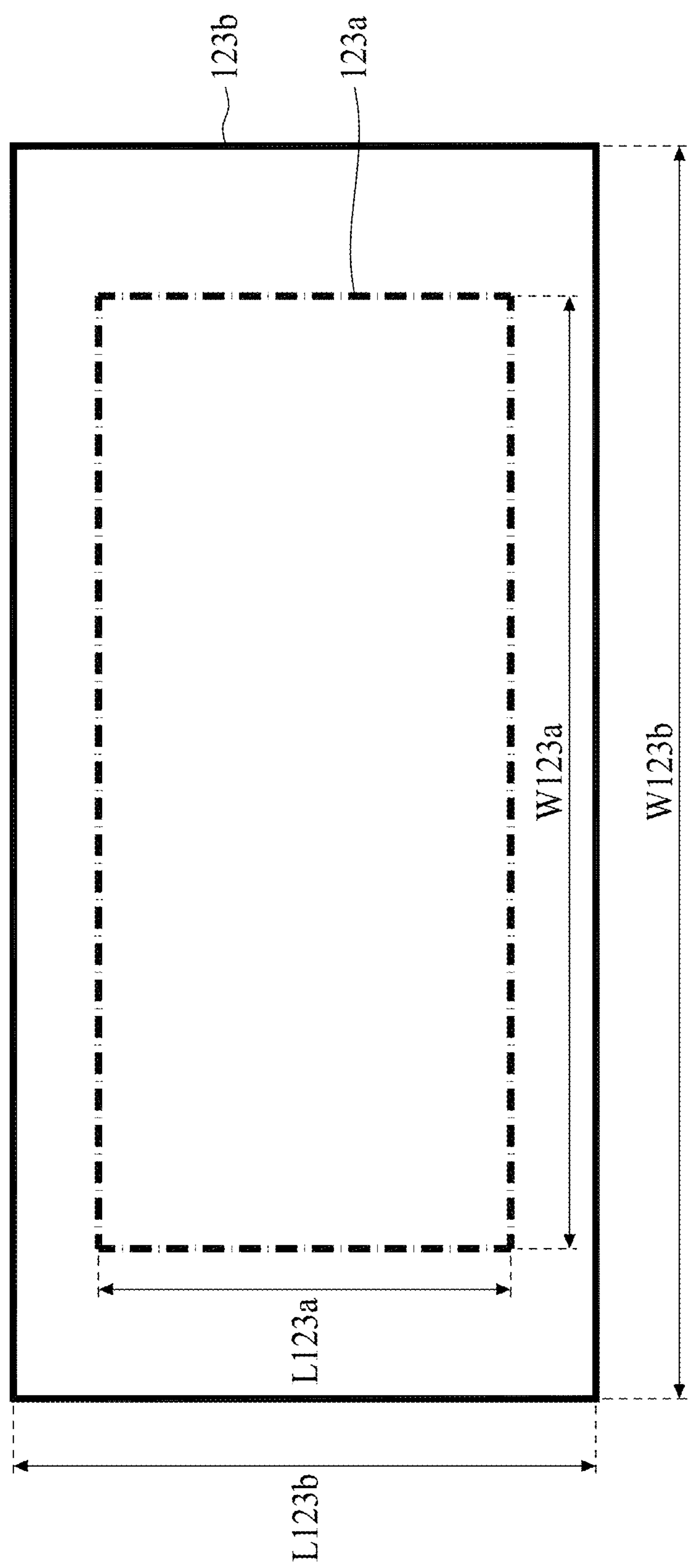
FIG. 2 is a top view of a conductive post of an interconnect structure, in accordance with some embodiments of the present disclosure.

Referring to FIG. 1 and FIG. 2, FIG. 2 is a top view of the conductive post 123, in accordance with some embodiments of the present disclosure. The conductive post 123 is in the sacrificial bilayer 20, wherein the conductive post 123 has a top pattern 123*b* coplanar with a top surface of the sacrificial bilayer 20, and a bottom pattern 123*a* coplanar with a bottom surface of the sacrificial bilayer 20 and in contact with a top surface of an $N^{th}$ metal line 121*b*. An area of the top pattern 123*b* is greater than the bottom pattern 123*a*. In some embodiments, the area of the top pattern 123*b* is substantially a tetragonal shape having a width W123*b* and a length L123*b* under top view. The area of the bottom pattern 123*a* is substantially a tetragonal shape having a width W123*a* and a length L123*a* under top view. A width W123*a* of the bottom pattern 123*a* is substantially equivalent to or narrower than a width Wt at the top surface of the $N^{th}$ metal line 121*b*. In some embodiments, the width W123*a* is in a range from about 5 nanometer to about 20 nanometer, and the length L123*a* is in a range from about 5 nanometer to 50 nanometer. In some other embodiments, the shape of the bottom pattern 123*a* is a square, wherein the width W123*a* and the length L123*a* are in a range from about 5 nanometer to about 20 nanometer.

A minimal distance D between the $N^{th}$ metal via 124 and an $N^{th}$ metal line 121*a*, which is being adjacent to the $N^{th}$ metal line 121*b*, is in a range from between about 50 Angstrom to about 200 Angstrom. If the minimal distance D is less than 50 Angstrom, the breakdown voltage in between may be decreased, thus inducing dielectric breakdown or aggravating the risk of failure. The minimal distance D can be less than 200 Angstrom to achieve miniaturization. As previously discussed, a total thickness of the first sacrificial layer 21 and the second sacrificial layer 22 may be in a range from about 40 Angstrom to 100 Angstrom. If the total thickness of the first sacrificial layer 21 and the second sacrificial layer 22 is less than 40 Angstrom, the minimal distance D may be too narrow, causing dielectric breakdown or aggravating the risk of failure. If the total thickness of the first sacrificial layer 21 and the second sacrificial layer 22 is greater than 100 Angstrom, the resistivity of the interconnect structure may be increased.

The dielectric layer 128 is disposed above the sacrificial bilayer 20. In some embodiments, the dielectric layer 128 may include oxide, silicon oxide, silicon oxynitride, low-k dielectric material or other suitable materials. The $N^{th}$ metal via 124 is further disposed above and in contact with the top pattern 123*a* of the conductive post 123. The $(N+1)^{th}$ metal line 125 is disposed above and electrically connected to the $N^{th}$ metal via 124. A seed layer 126 further conforms to a top surface of the $N^{th}$ metal lines 121, a sidewall of the conductive post 123, and a surface between the $N^{th}$ metal via 124 and the sacrificial bilayer 20.

Figure 3:
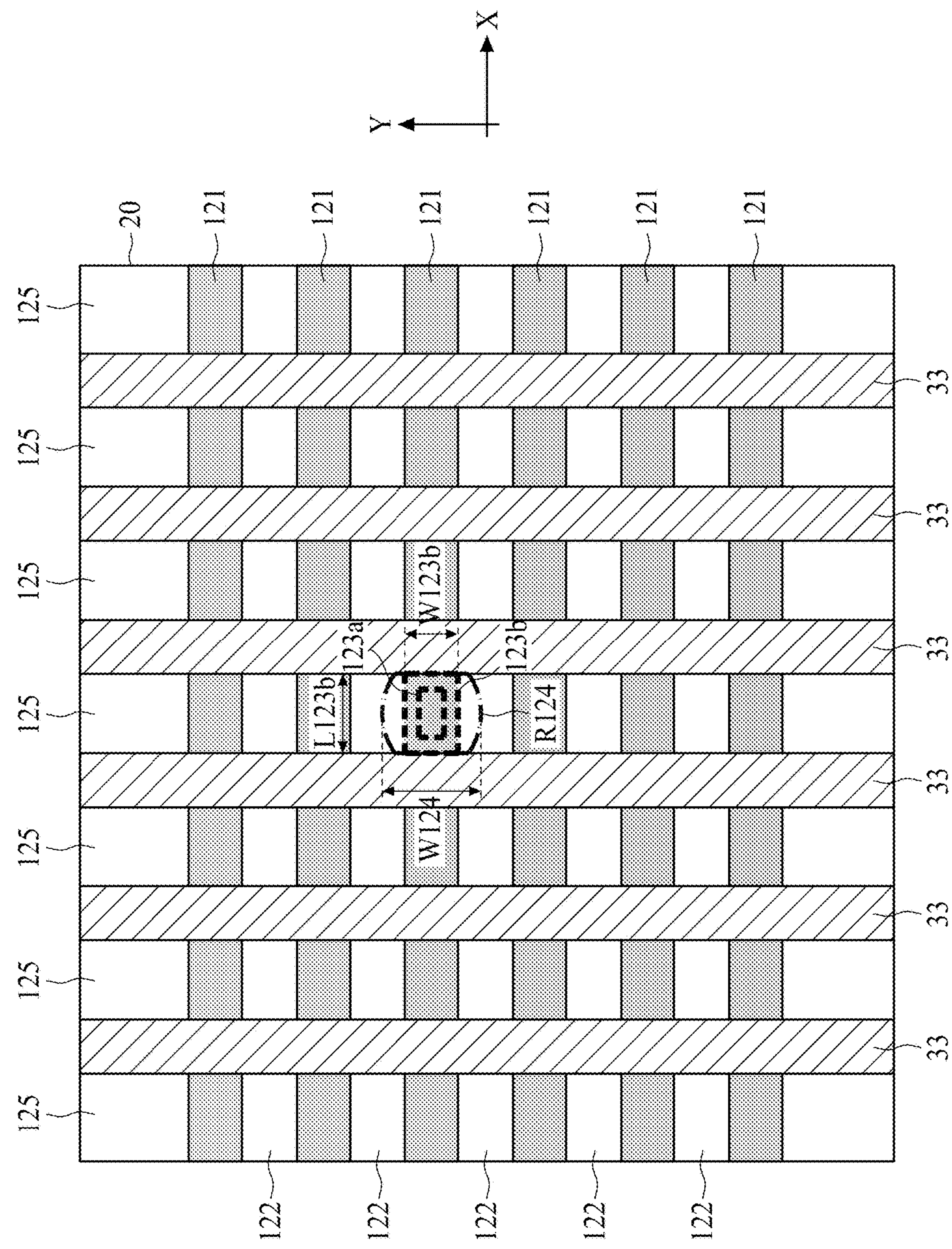
FIG. 3 is a cross section of an interconnect structure from top view, in accordance with some embodiments of the present disclosure.

Referring to FIG. 1 and FIG. 3, FIG. 3 is a cross section of an interconnect structure from top view, in accordance with some embodiments of the present disclosure. The $(N+1)^{th}$ metal line 125 is extending along a direction orthogonally to that of the $N^{th}$ metal lines 121. A width W124 of the $N^{th}$ metal via 124, or a width of the bottom surface of the $N^{th}$ metal via 124, is greater than the width W123*b* of the top pattern 123*b*. A region R124 of the bottom surface of the $N^{th}$ metal via 124 may have a cross section of a round shape, such as a shape similar to a circle or an ellipse, or a round shape with at least a side cut by secant lines or chords. In order to enhance the conductivity of the conductive post 123, the size of the top pattern 123*b* can be scaled up to a biggest tetragonal shape that can fit in the region R124, in order to decrease the series resistance. In some embodiments, the size of the top pattern 123_b_ can be smaller than the biggest tetragonal shape that fits the region R124. The area of the bottom pattern 123_a_ can be smaller than the aforesaid tetragonal shape and simultaneously overlapping the underlying $N^{th}$ metal lines 121 from a top view perspective. In some embodiments, when forming the $(N+1)^{th}$ metal line 125, a mask 33 is laid above the dielectric layer 128 and principally extends in the second direction Y orthogonal to the first direction X of the $N^{th}$ metal lines 121. A conductive material, e.g. Cobalt (Co), Ruthenium (Ru), Tungsten (W), Graphene, or the like, can be subsequently formed between adjacent masks 33 into the trench of the conductive post and the metal via trench.

The $N^{th}$ metal lines 121 principally extends in a first direction X, and the $(N+1)^{th}$ metal line 125 principally extends in a second direction Y orthogonal to the first direction X of the $N^{th}$ metal lines 121. A material of the $(N+1)^{th}$ metal line 125 may be similar to the $N^{th}$ metal line 121 thereof. A top surface of the $(N+1)^{th}$ metal line 125 may be coplanar with a top surface of the dielectric layer 128. The seed layer 126 may further space between the dielectric layer 128 and the $(N+1)^{th}$ metal line 125. In some embodiments, the aforesaid secant lines or chords cutting the region R124 is coplanar with at least one of the edges of the $(N+1)^{th}$ metal line 125.

Figure 4:
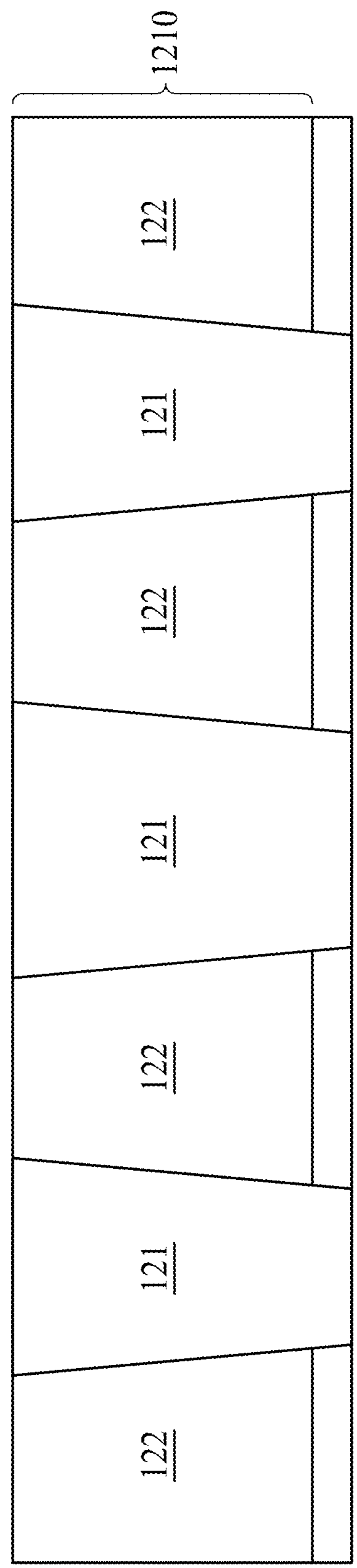
FIG. 4 to FIG. 15 are cross sections of an interconnect structure during intermediate stages of manufacturing operations, in accordance with some embodiments of the present disclosure.

Referring to FIG. 4, FIG. 4 is a cross section of an interconnect structure during an intermediate stage of manufacturing operations, in accordance with some embodiments of the present disclosure. The $N^{th}$ metal layer 1210 including the $N^{th}$ metal line 121 and the inter-metal dielectrics (IMDs) 122 is formed. The $N^{th}$ metal line 121 can be formed inside the IMDs 122 by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), deposition, or the like. The $N^{th}$ metal line 121 principally extends in the first direction X, as previously discussed in FIG. 3.

Figure 5:
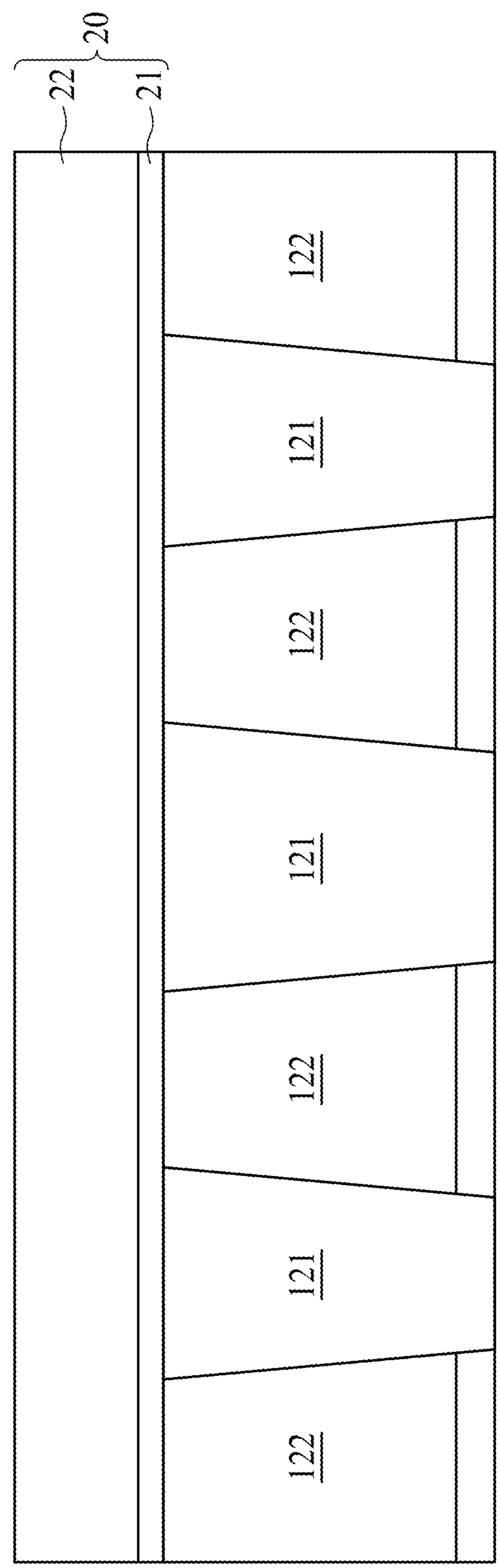

Referring to FIG. 5, FIG. 5 is a cross section of an interconnect structure during an intermediate stage of manufacturing operations, in accordance with some embodiments of the present disclosure. The sacrificial bilayer 20 is formed above the $N^{th}$ metal layer 1210, wherein the sacrificial bilayer 20 include the first sacrificial layer 21 proximal to the $N^{th}$ metal layer 1210 and the second sacrificial layer 22 distal to the $N^{th}$ metal layer 1210. The first sacrificial layer 21 may include metal oxides or metal oxynitrides, such as aluminum oxynitride (AlON), aluminum oxide (AlOx, e.g. $Al_2O_3$), or the like. The first sacrificial layer 21 can be formed by a variety of techniques, e.g. chemical-vapor deposition (CVD), physical vapor deposition (PVD), plasma-enhanced CVD (PECVD), atomic layer deposition (ALD), a combination thereof, or the like. The second sacrificial layer 22 may include silicide, oxide, carbide, oxycarbide, or nitride, such as silicon nitride (SiN), silicon carbon nitride (SiCN), silicon oxycarbide (SiOC), ornithine decarboxylase (ODC), or the like. The second sacrificial layer 22 can be formed by a variety of techniques, e.g. chemical-vapor deposition (CVD), plasma-enhanced CVD (PECVD), physical vapor deposition (PVD), atomic layer deposition (ALD), deposition, a combination thereof, or the like.

Figure 6:
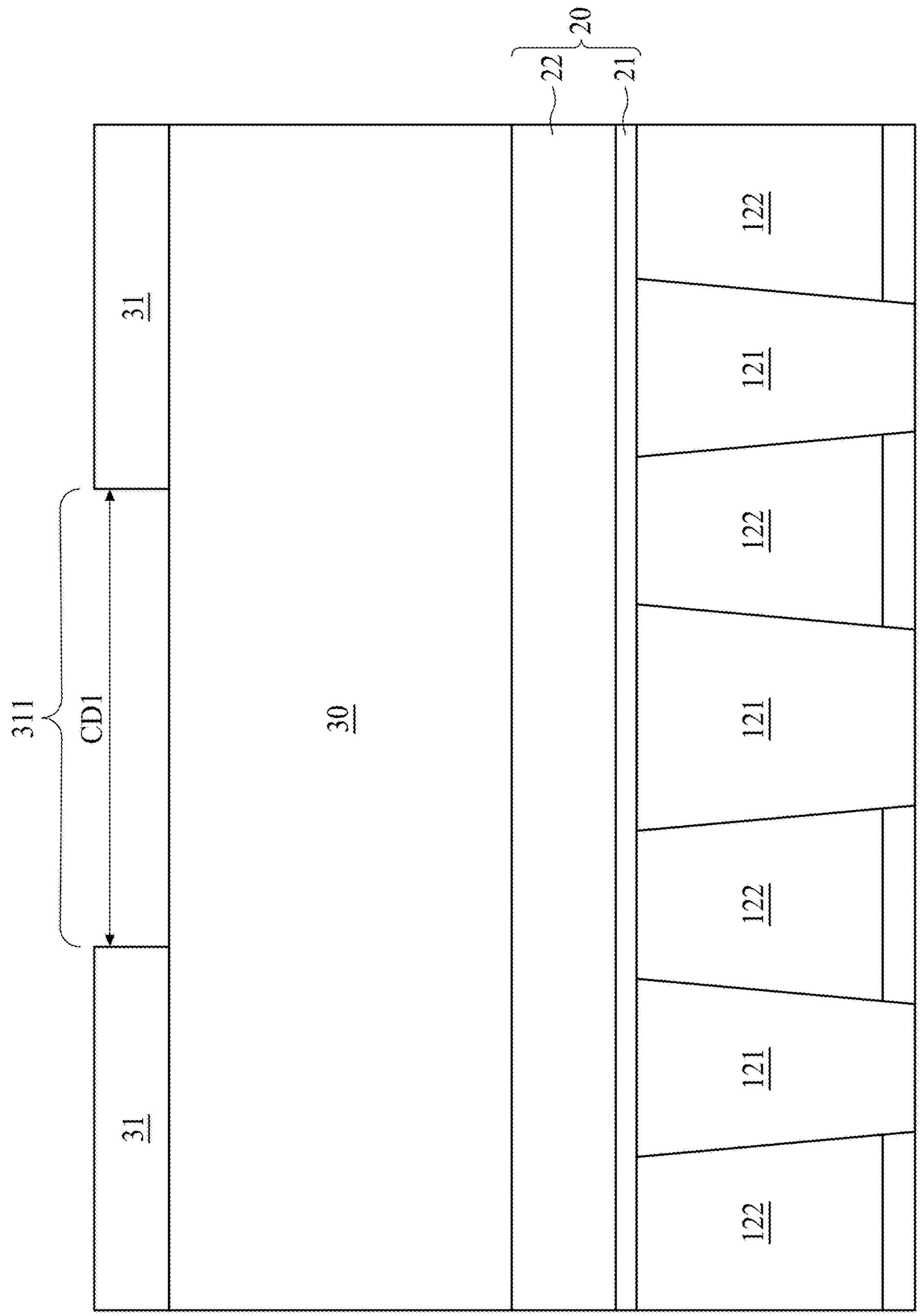

Referring to FIG. 6, FIG. 6 is a cross section of an interconnect structure during an intermediate stage of manufacturing operations, in accordance with some embodiments of the present disclosure. An anti-reflective coating 30 is formed above the sacrificial bilayer 20. The anti-reflective coating 30 may include materials that can be applied as bottom anti-reflective coating, such as organic material, inorganic material, polyamides, polysulfones, or the like. The materials of anti-reflective coating 30 is not limited thereto, other materials that can reduce reflection of light during photolithography patterning operation are under consideration. The anti-reflective coating 30 can be formed by a variety of techniques, e.g. spin coating, plasma-enhanced CVD (PECVD), chemical-vapor deposition (CVD), deposition, or the like. Subsequently a first mask 31 is formed patterned above the anti-reflective coating 30. In some embodiments, the first mask 31 can be a patterned photoresist layer. An opening 311 having a critical dimension CD1 is patterned on the first mask 31. In some embodiments, the opening 311 can be defined by photolithography operations such as exposure and/or developing.

Figure 7:
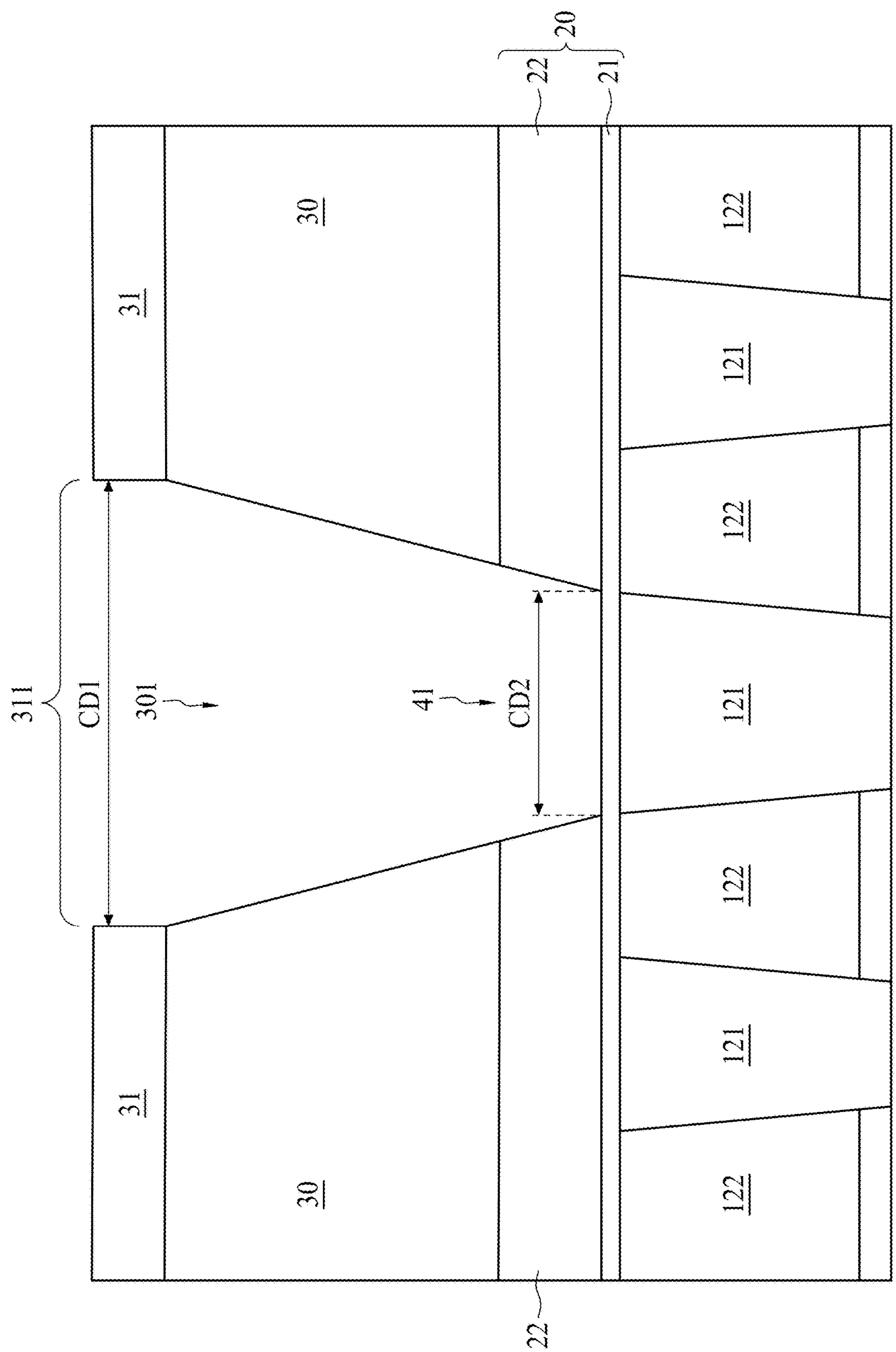

Referring to FIG. 7, FIG. 7 is a cross section of an interconnect structure during an intermediate stage of manufacturing operations, in accordance with some embodiments of the present disclosure. A portion of the anti-reflective coating 30 and a portion of the second sacrificial layer 22 are removed. In some embodiments, an etch operation, e.g. plasma etching, is performed through the opening 311 of the first mask 31. The etch operation for removing of the portion of the anti-reflective coating 30 and the portion of the second sacrificial layer 22 may entail negative etch bias, which can form a first recess 301 tapering toward the second sacrificial layer 22. Thence a second recess 41 is formed in the second sacrificial layer 22, wherein a critical dimension CD2 of the second recess 41 is less than the critical dimension CD1 of the opening 311. Alternatively stated, critical dimension shrinkage, which may be more significant than wet etching, may be performed by negative bias etch through the anti-reflective coating 30. The second recess 41 has a tapered profile, wherein the width W123_b_ (shown in FIG. 1) is greater than the critical dimension CD2. The etch operation stops at the first sacrificial layer 21, as a top surface of the first sacrificial layer 21 and a sidewall of the second sacrificial layer 22 is thereby exposed.

Figure 8:
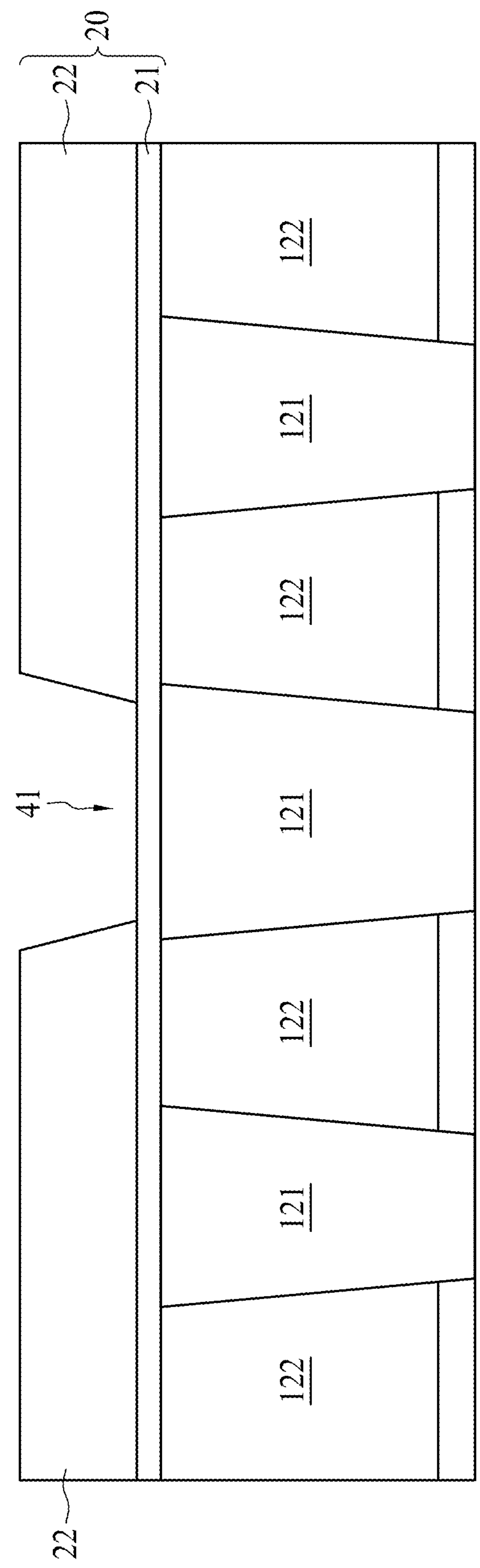

Referring to FIG. 8, FIG. 8 is a cross section of an interconnect structure during an intermediate stage of manufacturing operations, in accordance with some embodiments of the present disclosure. Subsequent to removing the portion of the anti-reflective coating 30 and the portion of the second sacrificial layer 22, the anti-reflective coating 30 and the first mask 31 is removed, and a top surface of the first sacrificial layer 21 is thereby exposed from the second sacrificial layer 22.

Figure 9:
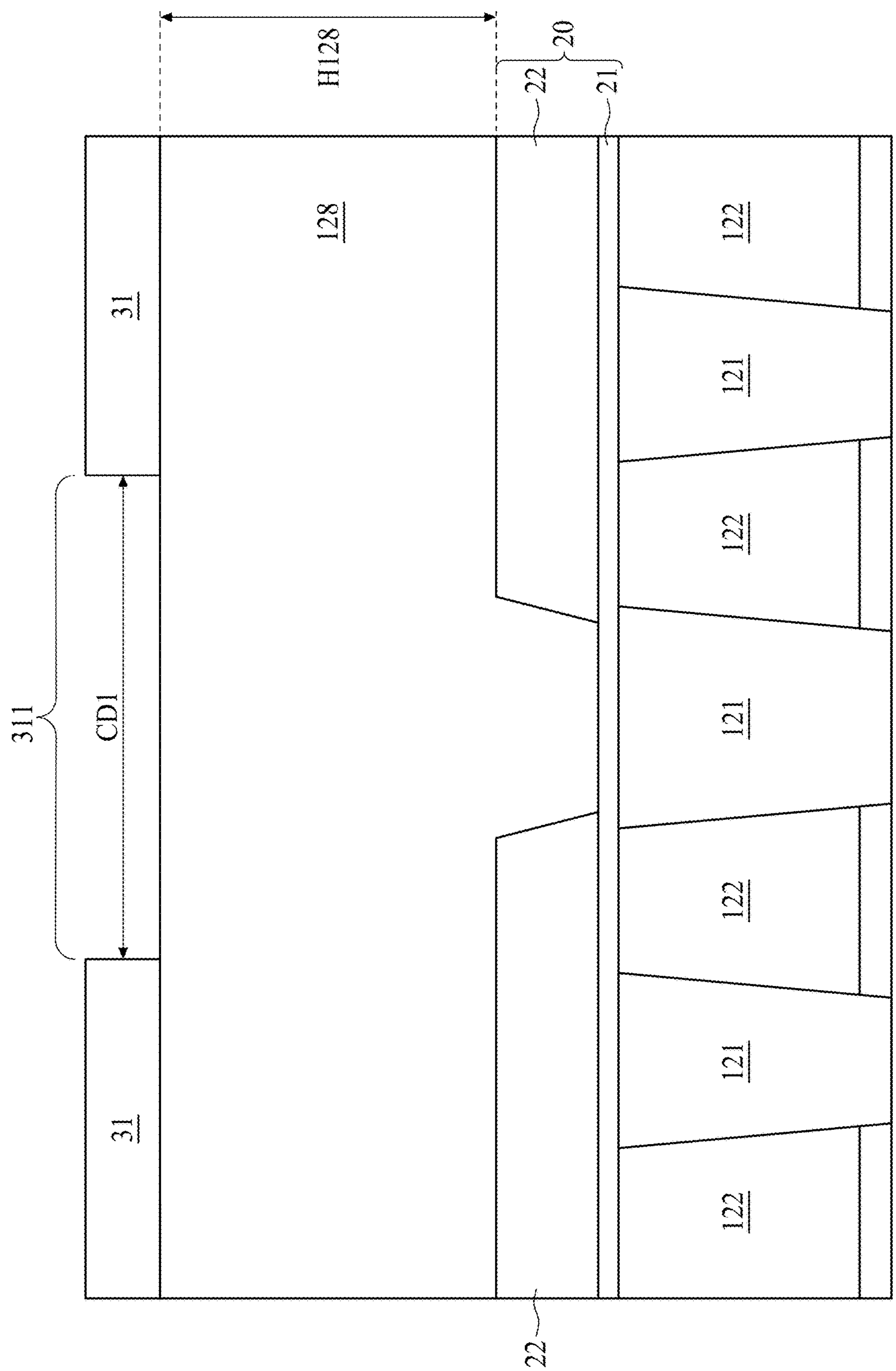

Referring to FIG. 9, FIG. 9 is a cross section of an interconnect structure during an intermediate stage of manufacturing operations, in accordance with some embodiments of the present disclosure. The dielectric layer 128 having a height H128 is formed above the second sacrificial layer 22 and an exposed top surface of the first sacrificial layer 21. Subsequently the first mask 31 is formed above the dielectric layer 128. The removed portion of the second sacrificial layer 22 is under the projection of the opening 311 of the first mask 31. It is noteworthy that the first mask 31 can be substituted by a mask different from the first mask 31, however, using the first mask 31 both in operations discussed in FIG. 9 to FIG. 10 and in operations previously discussed in FIG. 6 to FIG. 7 may achieve cost reduction and/or fabrication efficiency enhancement.

Figure 10:
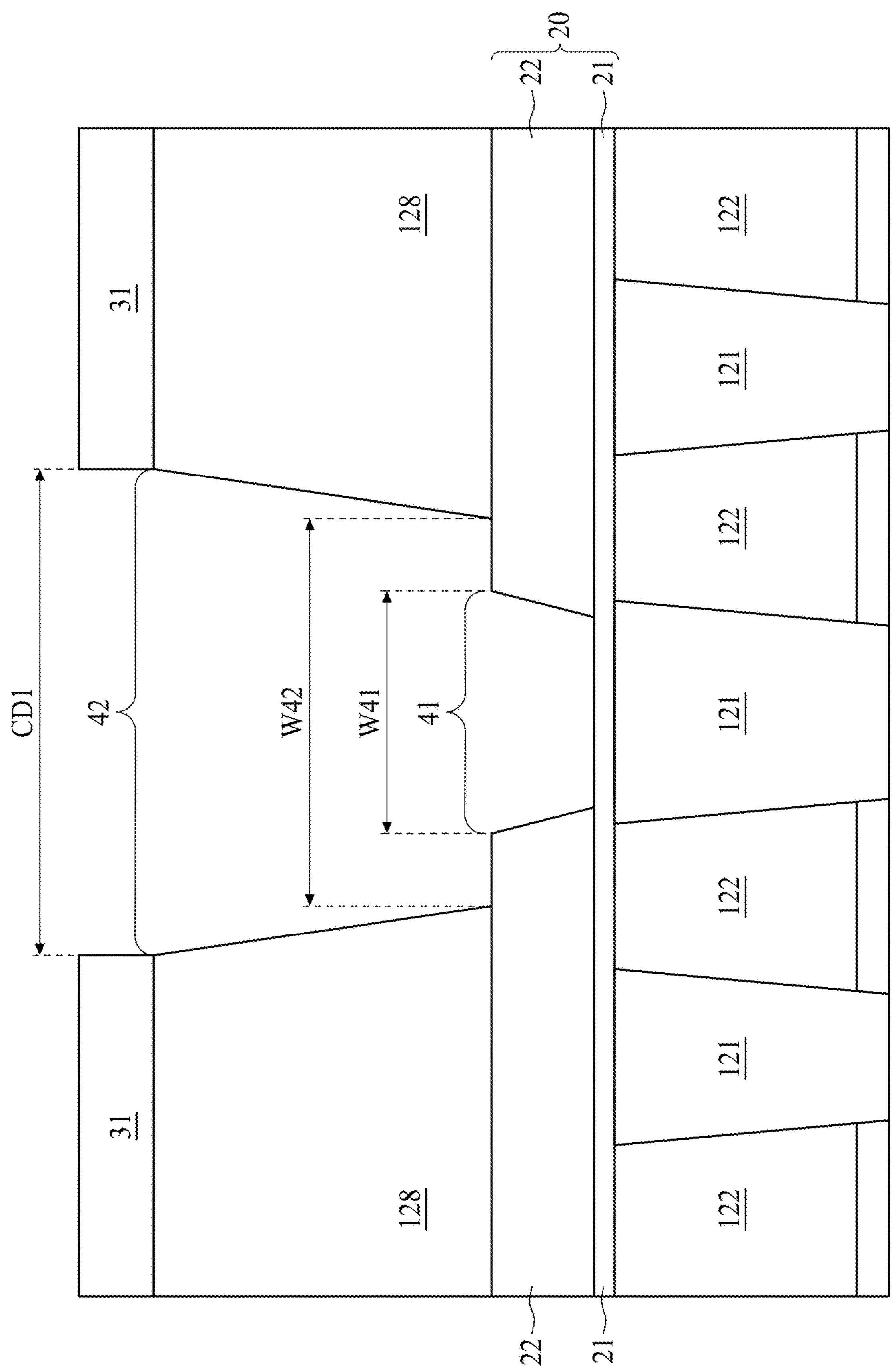

Referring to FIG. 10, FIG. 10 is a cross section of an interconnect structure during an intermediate stage of manufacturing operations, in accordance with some embodiments of the present disclosure. An etch operation is performed to remove a portion 42 of the dielectric layer 128 above the second sacrificial layer 22. The portion has a height substantially equal to H128 (shown in FIG. 9). A width W42 of a bottom surface of the portion 42 may be narrower than the critical dimension CD1 of the opening 311 (shown in FIG. 9) while wider than a width W41 of a top surface of the second recess 41. A top surface of the portion 42 may be aligned with the opening 311.

The etch operation herein may include wet etching, and an etchant utilized herein may have an etch rate on the dielectric layer 128 greater than an etch rate on the second sacrificial layer 22, and the etch rate on the second sacrificial layer 22 is greater than an etch rate on the first sacrificial layer 21. For example, the etchant has a selectivity of the dielectric layer 128 over the second sacrificial layer 22 can be in a range from about 4 to about 5. For another example, the etchant has a selectivity of the dielectric layer 128 over the first sacrificial layer 21 can be in a range from about 8 to about 10.

The distinction of etch rate under a predetermined etchant can be achieved by selecting suitable materials. As previously discussed in FIG. 1 and FIG. 5, the first sacrificial layer 21 may include metal oxides or metal oxynitrides, such as aluminum oxynitride (AlON), aluminum oxide (AlOx, e.g. $Al_2O_3$), or the like. The second sacrificial layer 22 may include silicide, oxide, carbide, oxycarbide, or nitride, such as silicon nitride (SiN), silicon carbon nitride (SiCN), silicon oxycarbide (SiOC), ornithine decarboxylase (ODC), or the like. The dielectric layer 128 may include oxide, silicon oxide, silicon oxynitride, low-k dielectric material or other suitable materials.

Figure 11:
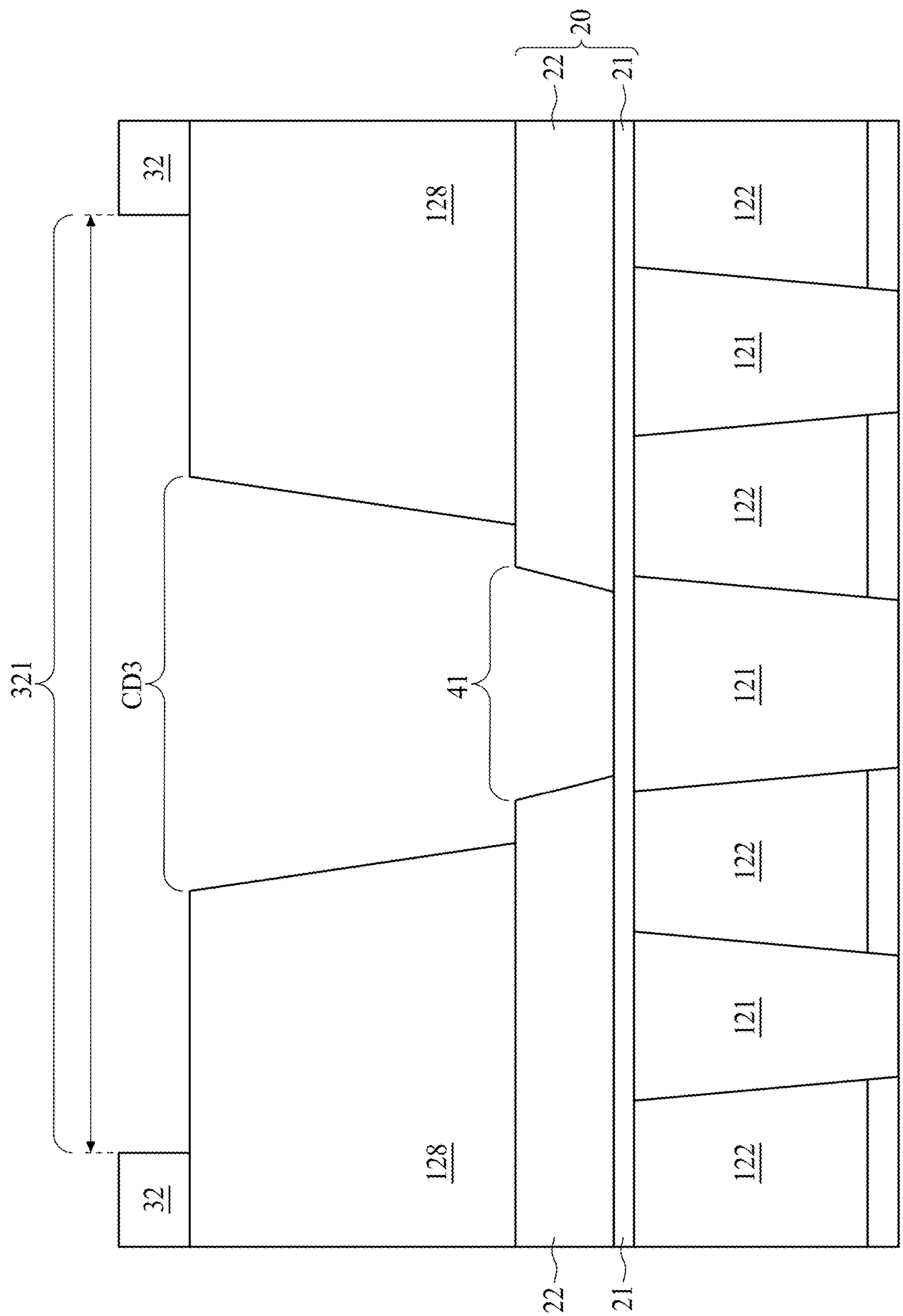

Referring to FIG. 11, FIG. 11 is a cross section of an interconnect structure during an intermediate stage of manufacturing operations, in accordance with some embodiments of the present disclosure. The first mask 31 is removed, and a second mask 32 different from the first mask 32 is subsequently formed above the dielectric layer 128. The second mask 32 is patterned to have an opening 321 over the second recess 41, wherein the opening 321 has a critical dimension CD3 greater than the critical dimension CD1 of the opening 311 of the first mask 31. In some embodiments, the second mask 32 can be a hard mask.

Figure 12:
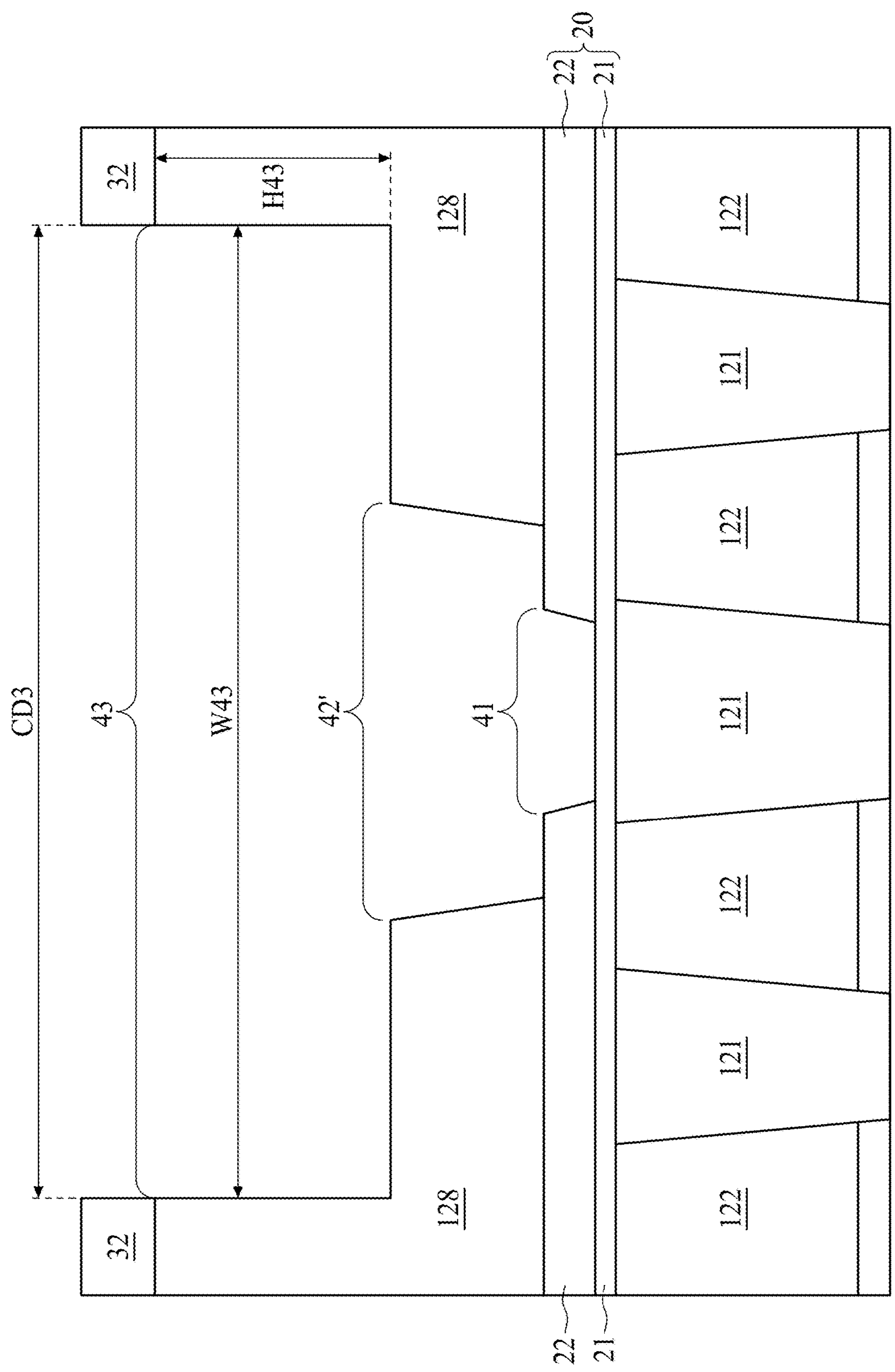

Referring to FIG. 12, FIG. 12 is a cross section of an interconnect structure during an intermediate stage of manufacturing operations, in accordance with some embodiments of the present disclosure. An upper portion 43 of the dielectric layer 128 is removed. The upper portion 43 has a width W43 substantially equal to the critical dimension CD3 of the opening 321 and wider than the critical dimension CD1 of the opening 311 of the first mask 31. A height 43 of the upper portion 43 is less than the height H128 of the dielectric layer 128 (shown in FIG. 9). Subsequent to removing the upper portion 43, a lower portion 42' of the portion 42 is remained and spaced between the upper portion 43 and the second recess 41. The second mask 32 is subsequently removed.

Figure 13:
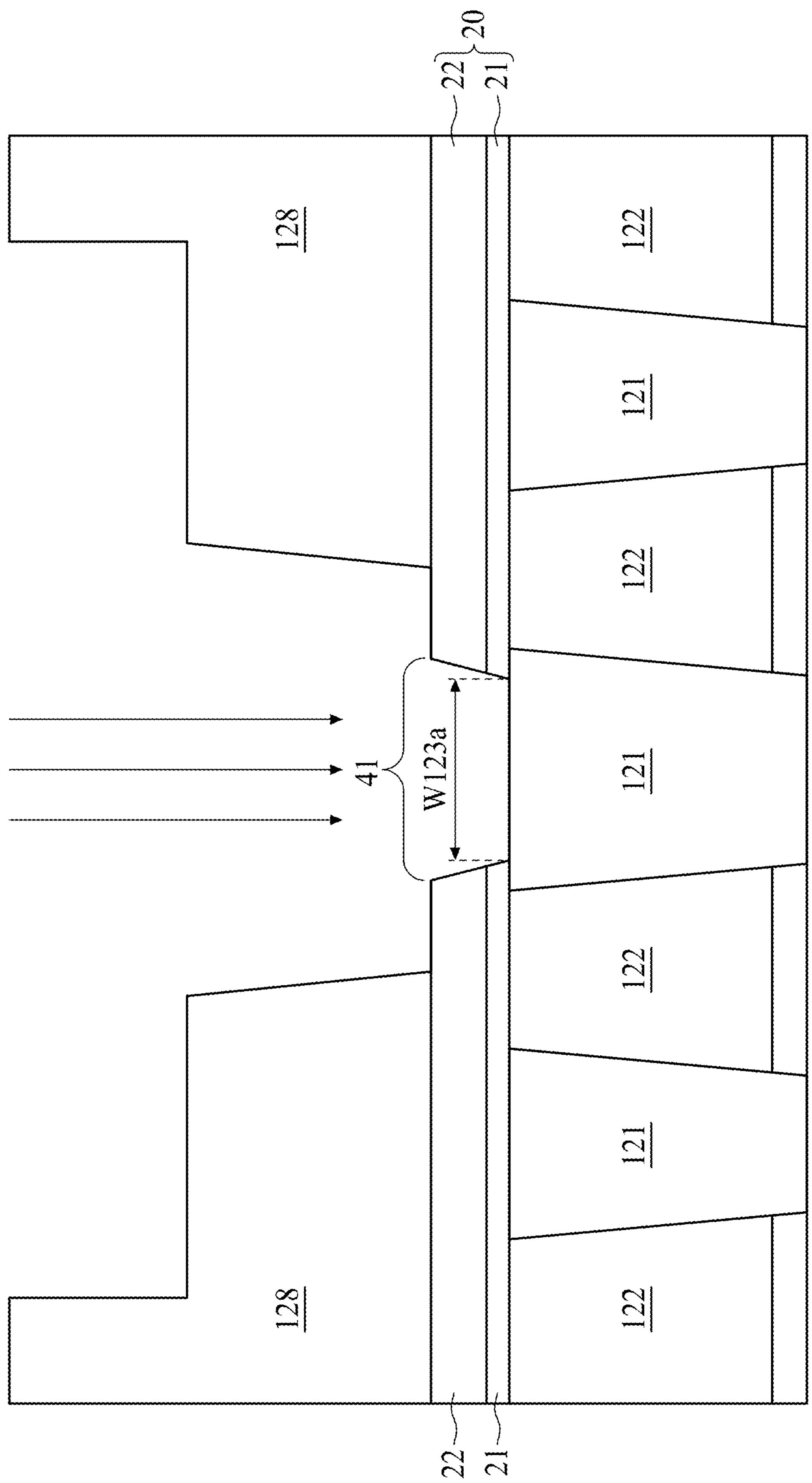

Referring to FIG. 13, FIG. 13 is a cross section of an interconnect structure during an intermediate stage of manufacturing operations, in accordance with some embodiments of the present disclosure. Subsequent to removing the second mask 32, a portion of the first sacrificial layer 21 is removed to expose a top surface of the $N^{th}$ metal line 121. In order to ameliorate the control over the removal operation thereof and alleviate the risk of damaging the $N^{th}$ metal line 121 and/or the IMDs 122 below the first sacrificial layer 21, the removal of the portion of the first sacrificial layer 21 may include one or more of operations, for example, a dry etch operation is performed to remove a portion of the first sacrificial layer 21. The dry etch operation may stop at the first sacrificial layer 21, with at least a thickness greater than 0 (not shown in FIG. 13) of the first sacrificial layer 21 remains above the top surface of the $N^{th}$ metal line 121. A selective wet etch operation is subsequently performed to remove the remaining portion of the first sacrificial layer 21 above the top surface of the $N^{th}$ metal line 121. An etchant utilized in the aforesaid selective wet etch operation may have a higher etch rate on the first sacrificial layer 21 than on the second sacrificial layer 22. A top surface having the width W123*a* of the $N^{th}$ metal lines 121 is thereby exposed.

Figure 14:
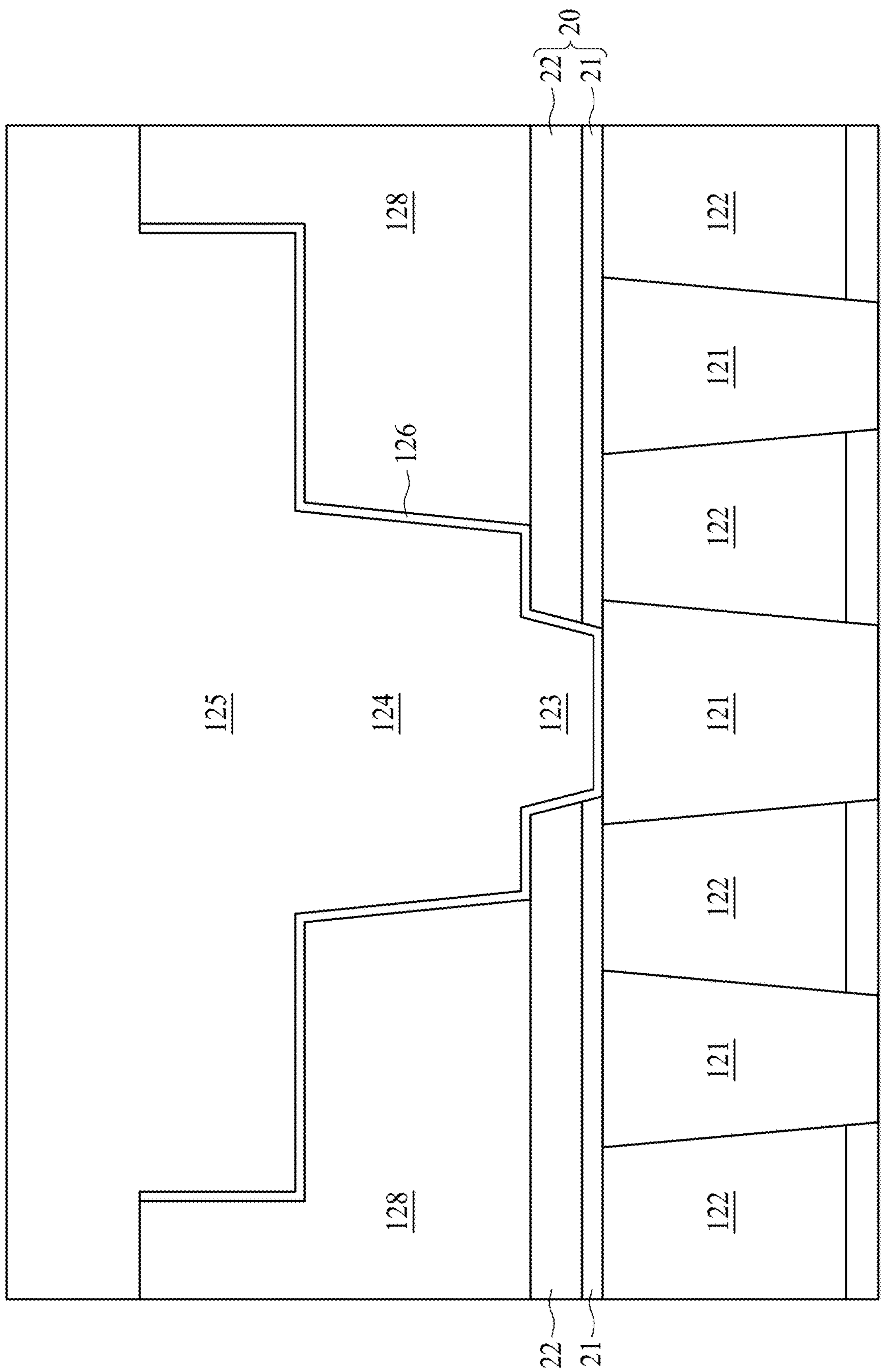
Figure 15:
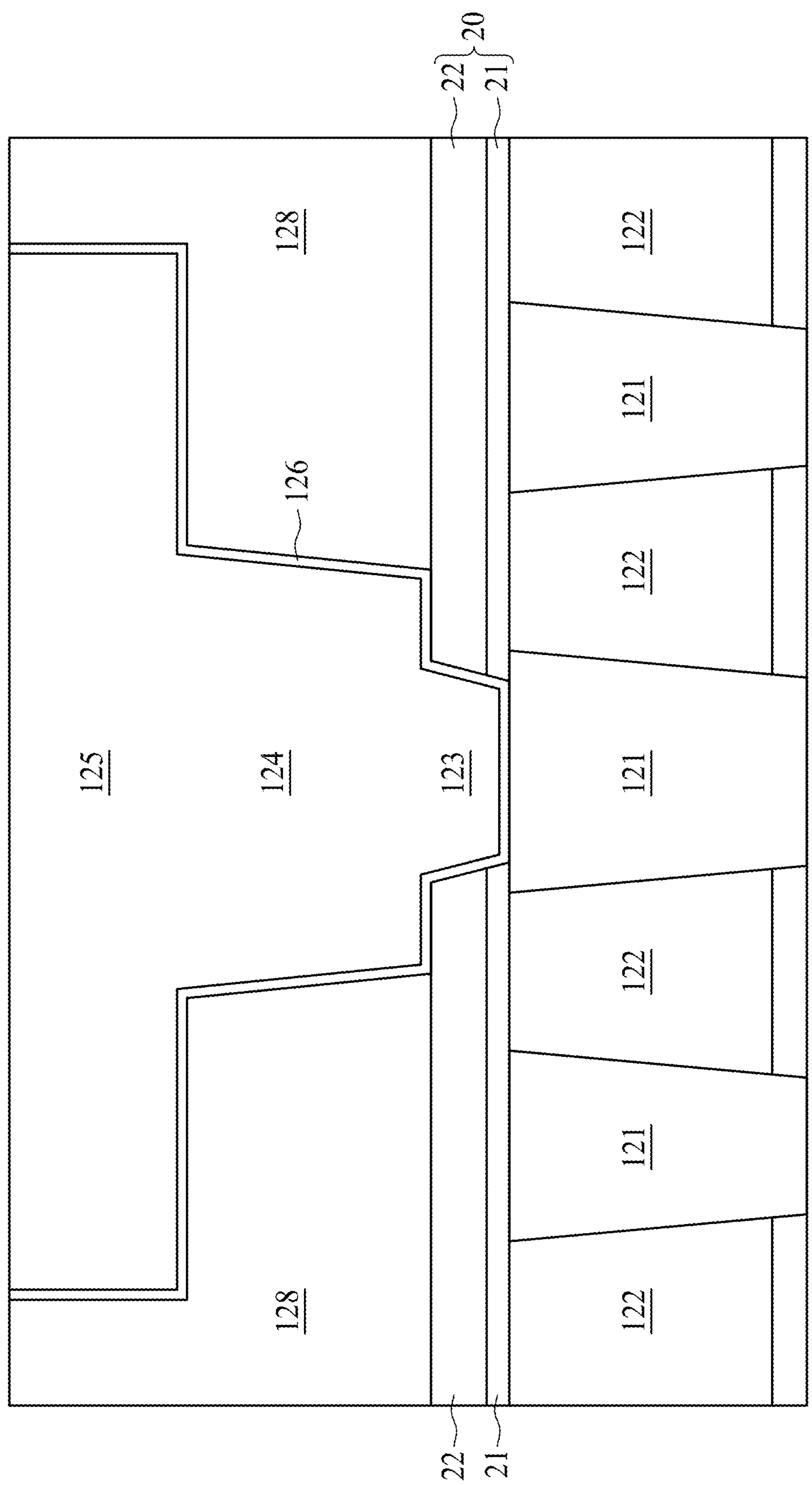

Referring to FIG. 14 and FIG. 15, FIG. 14 and FIG. 15 are cross sections of an interconnect structure during intermediate stages of manufacturing operations, in accordance with some embodiments of the present disclosure. The seed layer 126 is formed to conform the top surface of the $N^{th}$ metal lines 121, a sidewall of the removed portion of the first sacrificial layer 21, a sidewall of the removed portion of the second sacrificial layer 22, the exposed top surface of the second sacrificial layer 22, a sidewall of the lower portion 42' (shown in FIG. 12), a sidewall of the upper portion 43 (shown in FIG. 12), and a bottom surface of the upper portion 43 (shown in FIG. 12).

Referring to FIG. 14 and FIG. 15, the conductive material is subsequently formed in the removed portion of the sacrificial bilayer 20 and the lower portion 42' (shown in FIG. 12), and the upper portion 43 (shown in FIG. 12), then a chemical-mechanical planarization (CMP) operation is performed to remove excessive conductive material above the upper portion 43. Thereby the conductive post 123 and the $N^{th}$ metal via 124, and the $(N+1)^{th}$ metal line 125 are formed respectively. Herein the conductive post 123 has a top surface coplanar with a top surface of the sacrificial bilayer 20, and a bottom surface coplanar with a bottom surface of the sacrificial bilayer 20. The $(N+1)^{th}$ metal line 125 extends in second direction Y along with the mask 33 (shown in FIG. 3). In some embodiments, the masks 33 can be removed subsequent to the forming of the conductive material.

Some embodiments of the present disclosure provide interconnect structures with methods to alleviate the issues of voltage breakdown and/or leakage. By virtues of the sequence of removing a portion of the second sacrificial layer 22 and a portion of the first sacrificial layer 21 along with the distinctions of properties between the first sacrificial layer 21 and the second sacrificial layer 22, the landing area of the $N^{th}$ metal via 124 may be easier to be controlled, thus the induction of damaging the $N^{th}$ metal line 121 and/or the IMDs 122 below the first sacrificial layer 21 due to the errors of entailed operations (such as shifting in lithography overlay operations) may be alleviated.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a method for forming an interconnect structure, including forming an $N^{th}$ metal line principally extending in a first direction, forming a sacrificial bilayer over the $N^{th}$ metal line, forming a dielectric layer over the sacrificial bilayer, removing a portion of the sacrificial bilayer, forming a conductive post in the sacrificial bilayer, wherein the conductive post having a top pattern coplanar with a top surface of the sacrificial bilayer and a bottom pattern in contact with a top surface of the $N^{th}$ metal line, and forming an $N^{th}$ metal via over the sacrificial bilayer.

Some embodiments of the present disclosure provide a method for forming an interconnect structure, including forming an $N^{th}$ metal line principally extending in a first direction, forming a sacrificial bilayer above the $N^{th}$ metal line, removing a portion of a second sacrificial layer of the sacrificial bilayer by patterning with a first mask, forming a dielectric layer above the sacrificial bilayer, removing a lower portion of the dielectric layer over the $N^{th}$ metal line with the first mask, removing an upper portion of the dielectric layer over the $N^{th}$ metal line, and removing a portion of a first sacrificial layer of the sacrificial bilayer by a wet etch operation, wherein the first sacrificial layer is closer to the $N^{th}$ metal line than the second sacrificial layer, forming a conductive post in the sacrificial bilayer, wherein the conductive post having a top pattern coplanar with a top surface of the sacrificial bilayer and a bottom pattern in contact with a top surface of the $N^{th}$ metal line, and forming an $N^{th}$ metal via over the conductive post and the sacrificial bilayer.

Some embodiments of the present disclosure provide an interconnect structure, including an $N^{th}$ metal line, principally extending in a first direction, a sacrificial bilayer over the $N^{th}$ metal line, an $N^{th}$ metal via over the sacrificial bilayer, a conductive post in the sacrificial bilayer, the conductive post having a top pattern coplanar with a top surface of the sacrificial bilayer and a bottom pattern in contact with a top surface of the $N^{th}$ metal line, wherein a width of the bottom pattern is substantially equal to or narrower than a width at the top surface of the $N^{th}$ metal line, and wherein N is an integer greater than or equal to 1.

What is claimed is:

1. An interconnect structure, comprising:
a first metal line;
a second metal line spaced away from the first metal line;
a conductive contact over the first metal line, comprising;
a first portion;
a second portion over the first portion, wherein a bottom width of the second portion is greater than a top width of the first portion, wherein a shortest distance between the second portion and the second metal line is in a range from 50 Angstrom to 200 Angstrom; and
a third portion over the second portion, wherein a bottom width of the third portion is greater than a top width of the second portion, the entire first portion and the entire second portion are under a coverage of a vertical projection area of the third portion;
a sacrificial bilayer, comprising:
a first sacrificial layer, wherein a first portion of the first sacrificial layer is under a coverage of a vertical projection area of the first portion of the conductive contact; and
a second sacrificial layer over the first sacrificial layer, wherein a first portion of the second sacrificial layer is under a coverage of a vertical projection area of the first portion of the conductive contact, a thickness of the second sacrificial layer is greater than a thickness of the first sacrificial layer; and
a dielectric layer over a top surface of the second sacrificial layer, and comprises a first portion under a coverage of a vertical projection area of the third portion of the conductive contact.

2. The interconnect structure of claim 1, wherein the first sacrificial layer further comprises a second portion under a coverage of a vertical projection area of the second portion of the conductive contact.

3. The interconnect structure of claim 1, wherein the second sacrificial layer further comprises a second portion under a coverage of a vertical projection area of the second portion of the conductive contact.

4. The interconnect structure of claim 1, wherein the first sacrificial layer comprises metal oxides or metal oxynitrides.

5. The interconnect structure of claim 1, wherein the first sacrificial layer comprises an aluminum-containing material.

6. The interconnect structure of claim 1, wherein the second sacrificial layer is a silicon-derivative layer.

7. The interconnect structure of claim 1, wherein the second sacrificial layer comprises one of silicon nitride, silicon carbon nitride, silicon oxycarbide, or ornithine decarboxylase.

8. The interconnect structure of claim 1, wherein a total thickness of the sacrificial bilayer is in a range from 40 Angstrom to 100 Angstrom.

9. The interconnect structure of claim 1, further comprising a seed layer in direct contact with a sidewall of the first sacrificial layer and a sidewall of the second sacrificial layer, and spacing between the third portion of the conductive contact and a top surface of the dielectric layer.

10. The interconnect structure of claim 1, wherein the dielectric layer is in direct contact with the top surface of the second sacrificial layer.

11. A method for forming an interconnect structure, comprising:
forming a first metal line;
forming a sacrificial layer above the first metal line;
removing an upper portion of the sacrificial layer with a first mask;
forming a dielectric layer over the sacrificial layer subsequent to removing the upper portion of the sacrificial layer;
removing a portion of the dielectric layer over the first metal line with the first mask;
removing a lower portion of the sacrificial layer to form a through recess; and
forming a conductive post in the through recess.

12. The method of claim 11, further comprising forming an anti-reflective layer over the sacrificial layer prior to removing the upper portion of the sacrificial layer with the first mask.

13. The method of claim 12, further comprising removing the anti-reflective layer prior to forming the dielectric layer.

14. The method of claim 11, wherein a top surface of the sacrificial layer is exposed from the dielectric layer subsequent to removing the portion of the dielectric layer with the first mask.

15. The method of claim 11, wherein the sacrificial layer is a composite stack that includes a plurality of materials.

16. A method for forming an interconnect structure, comprising:

forming a first metal line;

forming a sacrificial bilayer over the first metal line, wherein the sacrificial bilayer comprises a first sacrificial layer and a second sacrificial layer over the first sacrificial layer;

forming an anti-reflective layer over the sacrificial bilayer;

forming a first recess in the second sacrificial layer to expose a top surface of the first sacrificial layer;

removing the anti-reflective layer after exposing the top surface of the first sacrificial layer;

forming a dielectric layer over the sacrificial bilayer;

forming a second recess in the first sacrificial layer and directly below the first recess, wherein a portion of the first sacrificial layer is free from being under a coverage of a vertical projection area of the second sacrificial layer subsequent to forming the second recess; and forming a conductive material in the first and second recess.

17. The method of claim 16, wherein a thickness of the second sacrificial layer is greater than a thickness of the first sacrificial layer.

18. The method of claim 16, wherein the anti-reflective layer is removed prior to forming the second recess.

19. The method of claim 16, wherein the removal of the anti-reflective layer stops at the top surface of the second sacrificial layer.

* * * * *